(12) United States Patent
Edwards et al.

(10) Patent No.: US 6,392,245 B1
(45) Date of Patent: May 21, 2002

(54) SCANNING WHEEL FOR ION IMPLANTATION PROCESS CHAMBER

(75) Inventors: Peter I. T. Edwards; Richard Cooke, both of West Sussex (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/462,756

(22) PCT Filed: Jul. 14, 1998

(86) PCT No.: PCT/GB98/02076

§ 371 Date: Mar. 3, 2000

§ 102(e) Date: Mar. 3, 2000

(87) PCT Pub. No.: WO99/04410

PCT Pub. Date: Jan. 28, 1999

(51) Int. Cl.[7] .............................................. H01J 37/317
(52) U.S. Cl. .............................. 250/492.21; 250/442.11
(58) Field of Search ........................ 250/492.21, 442.11

(56) References Cited

U.S. PATENT DOCUMENTS

| | | | |
|---|---|---|---|
| 4,733,091 A | * 3/1988 | Robinson et al. | 250/492.21 |
| 4,937,206 A | 6/1990 | Jaffe et al. | |
| 5,389,793 A | 2/1995 | Aitken et al. | |
| 5,525,807 A | * 6/1996 | Hirokawa et al. | 250/492.21 |
| 5,641,969 A | 6/1997 | Cooke et al. | |
| 5,981,961 A | * 11/1999 | Edwards et al. | 250/492.21 |
| 6,037,599 A | * 3/2000 | Takase et al. | 250/492.21 |

FOREIGN PATENT DOCUMENTS

| | | |
|---|---|---|
| EP | 0407985 A1 | 1/1991 |
| EP | 0458422 A2 | 11/1991 |

OTHER PUBLICATIONS

Japanese Abstract 06223769 dated Aug. 12, 1994.

* cited by examiner

Primary Examiner—Kiet T. Nguyen
(74) Attorney, Agent, or Firm—Boult Wade Tennant

(57) ABSTRACT

A scan wheel for an ion implanter adapted for carrying a plurality of semiconductor wafers. The scan wheel being rotatable about an axis comprises a central hub, a plurality of separate spoke arms mounted on and extending from the central hub, and a plurality of wafer support elements on the outer ends of respective spoke arms. Each spoke arm has a dimension in the direction of rotation substantially less than the dimension of the corresponding wafer support element, a front face extending generally in the direction of rotation and side faces extending rearwardly from the front face. Each side face does not extend outwards beyond a rearward projection of the corresponding front face which, in a cross section, tapers symmetrically inwards, preferably by 7°, on each side relative to the axis of rotation.

15 Claims, 1 Drawing Sheet

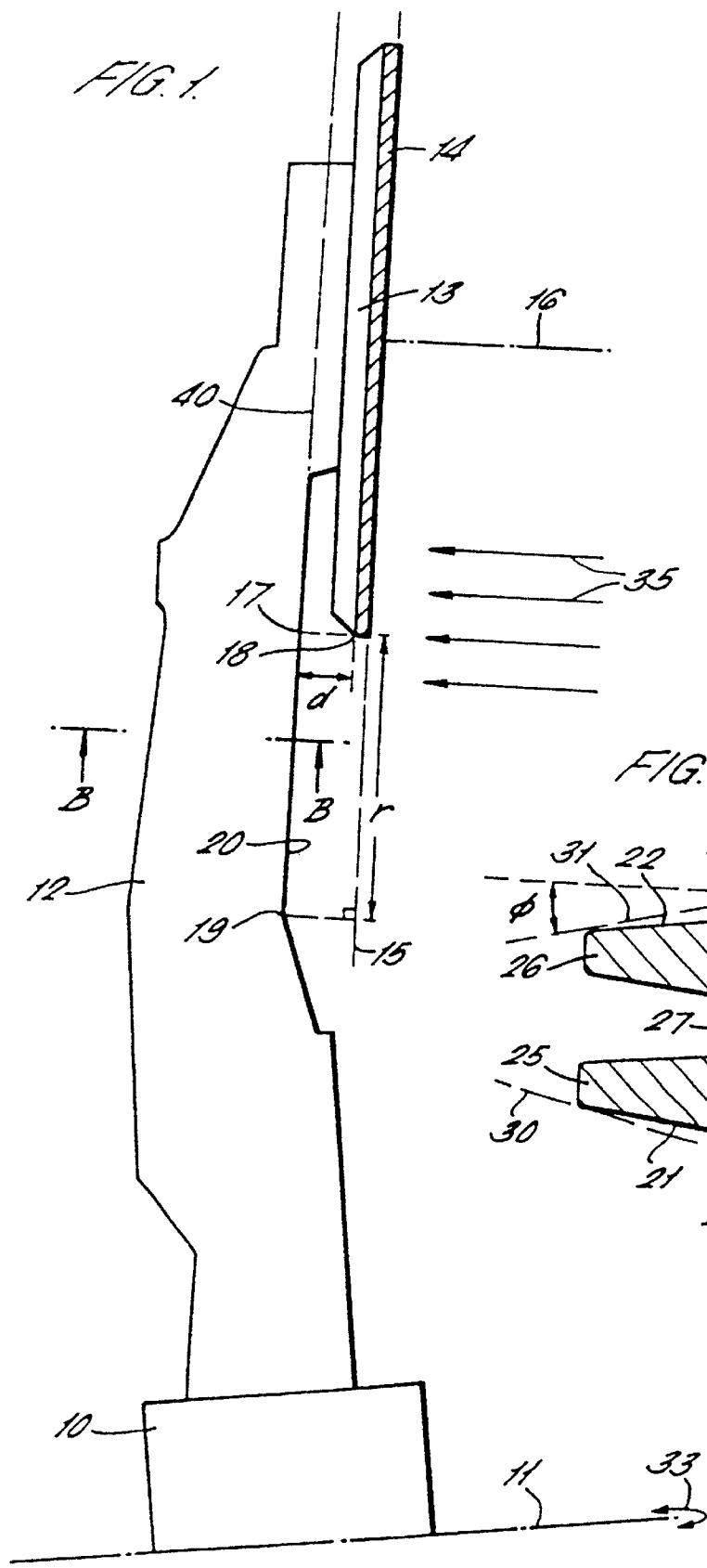

SCANNING WHEEL FOR ION IMPLANTATION PROCESS CHAMBER

This application is the national phase under 35 U.S.C. §371 of PCT International Application No. PCT/GB98/02076 which has an International filing date of Jul. 14, 1998, which designated the United States of America.

The present invention relates to improvements in scanning wheels used in ion implantation process chambers.

Ion implantation is used for doping semiconductor materials to achieve desired conductivity states. A beam of ions of a desired species for implantation is formed and directed at the surface of a semiconductor wafer for implantation therein. In batch processing ion implanters, it is a usual practice to arrange for a batch of semiconductor wafers to be processed simultaneously, and for these wafers to be repeatedly scanned through the ion beam to ensure a homogenous distribution of ions over the surfaces of the wafers.

U.S. Pat. No. 5,389,793 discloses a scan wheel used for scanning a batch of wafers in the process chamber of an ion implanter. The scan wheel disclosed in this U.S. patent specification comprises a central hub and a plurality of separate spoke arms mounted to the central hub, each having at its outer extremity a wafer support element for carrying a semiconductor wafer. The spoked scan wheel is rotated rapidly about an axis to achieve scanning of the wafers through the beam in one co-ordinate direction. At the same time, the axis of rotation of the scan wheel is reciprocated to and fro to achieve scanning of the wafers in a second co-ordinate direction. The combined scanning motions produce a raster scanning of the ion beam across each of the wafers held on the wafer support elements of the scan wheel.

The present invention is concerned with improvements to the design of the scan wheel as disclosed in the above U.S. patent specification. There is a need for increased processing speed, a reduction in the level of contamination in processing chambers, and the ability to handle larger wafers.

In one aspect the invention provides a scan wheel for an ion implanter adapted for carrying a plurality of semiconductor wafers, the scan wheel being rotatable about an axis for scanning wafers carried by the wheel across an ion beam generated in the implanter, said scan wheel comprising a central hub, a plurality of separate spoke arms mounted to said central hub and extending radially outward therefrom, and a plurality of wafer support elements formed on the outer ends of respective said spoke arms and each including a front face for mounting a semiconductor wafer thereon, said spoke arms each having a dimension in the direction of rotation which is substantially less than the corresponding dimension of the wafer support element, and said spoke arms each having a front face extending generally in said direction of rotation and side faces extending rearwardly from said front face, wherein, at least over a predetermined radial distance inwards from an innermost edge of the respective wafer support element, each of said side faces has a major part which does not extend outwards beyond a rearward projection of said front face which, in cross-section, tapers symmetrically inwards, preferably by 7°, on each side relative to said axis of rotation.

The design of scan wheel using relatively narrow spoke arms supporting the larger wafer support elements reduces the surface area of the scan wheel which is irradiated by the ion beam during that part of the scanning process, called maximum over scan, when the axis of rotation of the scan wheel is at its closest to the ion beam so that the ion beam is just clear of the innermost edges of the wafers mounted on the wafer support elements. This is desirable not only to reduce the thermal loading on the scan wheel resulting from the energy of the ion beam dissipated on the spoke arms, in addition to the energy dissipated on the semiconductor wafers supported by the support elements, but also to reduce the area of the scan wheel from which contaminants may be sputtered during irradiation by the ion beam. Any such sputtered contaminants may produce contamination on the surface of the semiconductor wafer being processed and increase unwanted material on the processed wafers.

It is established practice to arrange for the axis of rotation of the scan wheel to be adjustable relative to the direction of the ion beam, with the effect that the angle of implant of ions into the semiconductor wafers can be correspondingly adjusted. In implanters available currently, implant angle is typically adjustable between plus and minus 10° to the normal. An arrangement of this kind is shown in U.S. application Ser. No. 08/626,746.

In the design of process chamber illustrated, adjusting the axis of rotation of the scan wheel to provide a desired implant angle has the effect of adjusting the angle of the semiconductor wafers as they traverse the ion beam about an axis generally parallel to the spoke arm on which the semiconductor wafer is mounted. As a result, when the implant angle is set to be other than normal to the wafer surface, the spoke arms traverse the ion beam also with a corresponding longitudinal angle of rotation.

By arranging for the side faces of the spoke arms not substantially to extend beyond a tapered rearward projection of the front face of the spoke arm, the side faces can be shadowed by the front face of the respective arm for a range of implant angles on either side of normal. This is important since the total area of the spoke arms irradiated by the ion beam during this part of the scan is thereby reduced. Indeed, for a taper of 7° and implant angles of less than about 7°, the side faces of the spoke arms should scarcely be irradiated by the ion beam.

It is also known from U.S. Pat. No. 4,937,206 to coat areas of a scan wheel which are liable to be irradiated by the ion beam with a process compatible material, typically silicon. This minimises contamination problems from any of the material being sputtered from the scan wheel during processing.

By minimising the risk of the ion beam contacting the side faces of the spoke arms, it can be unnecessary to provide any such compatible coating on the side faces, so that only the front face of the spoke arms need be coated.

Preferably, each spoke arm comprises a first radial flange piece extending generally in the plane of rotation of the scan wheel and providing said spoke arm front face, and at least one radial web piece extending generally in an axial plane and connected to a rear face of the flange piece. In a particular embodiment, each spoke arm includes two said radial web pieces having a space between them in the direction of rotation.

This construction provides excellent strength and rigidity with reduced mass.

The radial web pieces have respective outwardly directed side faces which form said major parts of said spoke arm side faces.

Preferably, the major parts of the spoke arm side faces do not extend outwards beyond a rearward projection of said front face which, in cross-section, tapers symmetrically inwards by 10°, and more preferably by 12°–13°, on each side relative to said axis of rotation. This increased tapering effect allows a maximum implant angle of up to plus or minus 10° without the ion beam impinging on the side faces of the spoke arms.

In a preferred embodiment, each said wafer support element front face is adapted to mount a semiconductor wafer thereon in a wafer mounting plane defining a wafer axis normal to said wafer mounting plane, and, at least over said predetermined radial distance inwards from an innermost edge of the respective wafer support element, each spoke arm front face has no region facing towards the respective said wafer axis. This arrangement is preferably, though not necessarily, used with the tapered profile feature described above.

By ensuring that the spoke arm front faces do not face towards the wafer axis over the predetermined radial distance, the danger of contamination of the wafer during over scanning, i.e. when the ion beam impinges on the spoke arm front faces, is reduced. Material sputtered from the front faces of the spoke arms by the impinging ion beam have an angular distribution relative to the surface of the front face with a maximum at the normal to the front face. Therefore, if the front face of the spoke arm faces towards the axis of the wafer, sputtered material tend to be ejected into the region in front of the wafer, thereby increasing the probability of contaminating the wafer surface.

In fact, it is preferable if said spoke arm front faces face away from the respective said wafer axes.

In a further embodiment, at least over said predetermined radial distance, said spoke arm front faces are angled towards said wheel axis. Then, any discrete sheet of coating material, as contemplated in U.S. Pat. No. 4,937,206, applied to the front faces of the spoke arms is retained firmly against the front faces by centrifugal force when the scan wheel is spinning during an implant process. In this way, there is reduced risk of such a coating material becoming detached during processing and the problem of securing the coating material to the spoke arm front faces is alleviated. Also the centrifugal force improves thermal contact between the coating material and the arm.

This orientation of the spoke arm front faces towards the wheel axis is preferably, though not necessarily, used with one or both of the above mentioned tapered spoke arm cross-section feature and contamination reduction feature.

In practice the spoke arm front faces may be angled relative to a radial plane at between 3° and 10°.

In a further preferred embodiment, at least over said predetermined radial distance, said spoke arm front faces are planar. This planar construction greatly facilitates the ability to affix replaceable screening coatings to the front faces of the spoke arms. Once again this planar spoke arm front face feature is preferably, though not necessarily, used with any one or a combination of the aforementioned features.

Conveniently, each said wafer support element front face is adapted to mount a semiconductor wafer thereon in a wafer mounting plane facing towards said wheel axis. This arrangement ensures that centrifugal force will assist in retaining the semiconductor wafer in position on the wafer support element during rotation of the scan wheel.

The aforementioned predetermined radial distance inwards along each spoke arm from an innermost edge of the respective wafer support element is preferably greater than about 50 mm. The important criterion is for this distance to be greater than the beam dimension in this direction so that the spoke arms have the described characteristics everywhere that the ion beam is likely to impinge along the radial length of the spoke arms. A typical ion beam width in the radial direction of the spoke arm is 50 mm. In practice, the predetermined radial distance along the spoke arms may be between 70 and 110 mm.

In a further preferred embodiment, each said wafer support element front face has a radially innermost edge and said spoke arm front face has a portion immediately radially inside said innermost edge of the respective wafer support element front face which is spaced at least 1 cm behind said innermost edge in the direction of said axis.

This feature also assists in reducing the likelihood of contamination of the semiconductor wafers due to materials sputtered from the spoke arms during processing. Preferably the spacing is as great as possible and in one example about 1.5 cms.

This spacing feature may also be used independently but preferably in addition to one or more of the previously described features.

An example of the present invention will now be described with reference to the accompanying drawing in which:

FIG. 1 is a schematic representation of a single spoke arm of a spoked scan wheel embodying features of the present invention; and FIG. 2 is a cross-sectional view of the spoke arm taken along lines B—B of FIG. 1.

As mentioned previously U.S. Pat. No. 5389793 discloses ion implantation apparatus which includes a spoked scan wheel for scanning a batch of wafers through an ion beam in a process chamber. The disclosure of the above U.S. specification is incorporated herein by reference.

FIG. 1 illustrates a single spoke arm of a spoked scan wheel viewed in an axial plane. Thus, the scan wheel comprises a hub 10 mounted for rotation about a scan wheel axis 11. The wheel may include as many as 25 spokes, each comprising a spoke arm 12 mounted on the hub 10 and carrying at its outer extremity a wafer mounting element 13. In FIG. 1, the wafer mounting element 13 is shown carrying a wafer 14 in a wafer mounting plane 15 and defining a wafer axis 16.

The wafer 14 may be carried on the wafer support element 13 in a manner known in the prior art. The wafer axis 16 is an axis of symmetry of the wafer 14 and is normal to the plane 15 of the wafer 14.

As can be seen in FIG. 1, the wafer mounting element 13 is arranged to carry the wafer 14 so that the plane 15 of the wafer faces somewhat towards the axis 11 of rotation of the scan wheel. As a result, when the wheel is rotating at high speed during an implant process, centrifugal force tends to push the wafer 14 against the wafer support element 13 which, inter alia, enhances wafer cooling.

FIG. 2 shows a cross-sectional view of part of the spoke arm 12. The spoke arm 12 has the cross-section illustrated in FIG. 2 (with slight dimensional variations) from a radially outer point 17 corresponding to the innermost edge 18 of the wafer support element 13 to a radially inner point 19 which is at a predetermined distance r radially inside the point 17 in the plane 15 of the wafer 14. This distance r should be greater than the width of the ion beam in this direction when intercepted by the spoke arm, and is about 100 mm in the present example.

Referring to FIG. 2, the spoke arm has a front face 20 and side faces 21 and 22. The front face extends radially with the spoke arm and extends in the direction of rotation of the scan wheel represented by the arrow 23. The side faces 21 and 22 extend rearwards from the front face, the front face being defined as that facing the direction from which the ion beam strikes the scan wheel during an implant process.

The spoke arm over the defined region is formed of a flange piece 24 which also extends in the direction 23 and provides the front face 20 of the spoke arm. A pair of web pieces 25 and 26 extend generally in planes parallel to the plane containing the axis 11 of rotation of the scan wheel, and are connected to the rear face of the flange piece 24. A channel 27 is formed between the web pieces 25 and 26.

The side faces 21 and 22 of the spoke arm are constituted by opposed outer faces of respective web pieces 25 and 26. These outer faces forming the side faces 21 and 22 are set inside the lateral edges 28 and 29 of the flange piece 24 so that no part of the flange pieces 25 or 26 extend outwards (in the direction of rotation 23) beyond a tapered rearward projection of the front face 20 as defined by the dotted lines 30 and 31 in FIG. 2. The dotted lines 30 and 31 define a symmetrical inwards taper behind the front face 20 with a taper angle φ of about 12°, in this example.

As can be seen in FIG. 2, the greater part of the side faces 21 and 22 do not extend outwards beyond the tapered projection lines 30 and 31. However, relative to the lateral edges of the front face 20 itself, a small part of each lateral edge of the flange piece 24 does project outside the lines 30 and 31.

As explained previously, the axis 11 of rotation of the scan wheel can itself be adjusted by rotation in a plane perpendicular to the paper in FIG. 1, by up to plus or minus 10°. This rotational adjustment of the scan wheel axis 11 is illustrated by the arrows 33 in FIG. 1 and has the effect of rotating the position of spoke arm 12 as it intersects the ion beam about a radial axis perpendicular to the axis 11 as illustrated by the arrow 34 in FIG. 2. The purpose of this angular adjustment of the axis 11 of the scan wheel is to permit a selected angle of implant between the beam direction, illustrated by arrows 35 in FIG. 1 and the plane of the wafer 14. This can best be understood from FIG. 2 in which the beam direction is represented by arrows 36 when the wheel axis 11 has been adjusted about 10° to one side of the normal direction relative to the ion beam. As can be seen from FIG. 2, the tapered profile of the spoke arm illustrated allows the major part of the side faces 21 and 22 of the spoke arm to be shadowed by the front face 20 so that the ion beam will not impinge on the side faces even when the scan wheel axis is canted for maximum ion implant angle.

In FIG. 2, the front face 20 of the spoke arm is shown covered with a layer 37 of process compatible material. This layer 37 may comprise a detachable sheet of the process compatible material, typically silicon. In order to protect the lateral edges 28 and 29 of the flange piece 24 of the spoke arm from the ion beam, the sheet 37 of coating material may extend slightly wider than the width of the front face 20.

However, instead of a detachable coating sheet 37, the front face 20 and the side edges 28 and 29 may be permanently coated with a silicon layer, e.g. by plasma spraying.

In either arrangement, it is not necessary to provide any coating on the main part of the side faces 21 and 22 which are fully shadowed by the front face over all angular adjustments of the scan wheel axis 11.

Referring again to FIG. 1, the front face 20 of the spoke arm between the points 17 and 19 is slightly angled away from the wafer axis 16. The angle between the wafer plane 15 and the plane 40 containing the front face 20 of the spoke arm may be less than 1°. However, it is important that the front face 20 is not angled towards the axis 16. By ensuring this angle for the front face 20 of the spoke arm which may be irradiated by the ion beam during processing, contamination of the wafer 14 during processing is reduced.

The front face 20 of the spoke arm is also angled towards the axis 11 of rotation of the scan wheel. Then, if the front face 20 is protected by a replaceable sheet 37 of process compatible material, this sheet is held against the front face 20 by centrifugal force whilst the wheel is spinning. This allows the sheet to be attached to the front face 20 more easily.

As shown in FIGS. 1 and 2, the front face 20 of a spoke arm is planar at least between the points 17 and 19. This also facilitates attachment thereto of a replaceable protection sheet 37 of process compatible material.

Referring again to FIG. 1, the front face 20 is illustrated stepped behind the innermost edge 18 of the wafer support element 13 by about 1.5 cms as illustrated by the distance d. As a result, the risk of any incompatible material being sputtered from the front face 20 of the spoke arm during processing and contaminating the wafer 14 is further reduced.

What is claimed is:

1. A scan wheel for an ion implanter for carrying a plurality of semiconductor wafers, the scan wheel being rotatable about an axis for scanning wafers carried by the wheel across an ion beam generated in the implanter, said scan wheel comprising
   a central hub,
   a plurality of separate spoke arms mounted to said central hub and extending radially outward therefrom,
   and a plurality of wafer support elements formed on the outer ends of respective said spoke arms and each including a front face for mounting a semiconductor wafer thereon, said spoke arms each having a dimension in the direction of rotation which is substantially less than the corresponding dimension of the wafer support elements, and said spoke arms each having a front face extending generally in said direction of rotation and side faces extending rearwardly from said front face,
   wherein, at least over a predetermined radial distance inwards from an innermost edge of the respective wafer support element, each of said side faces has a major part which does not extend outwards beyond a rearward projection of said front face which, in cross-section, tapers symmetrically inwards by 7° on each side relative to said axis of rotation.

2. A scan wheel as claimed in claim 1, wherein each spoke arm comprises a first radial flange piece extending generally in the plane of rotation of the scan wheel and providing said spoke arm front face and at least one radial web piece extending generally in an axial plane and connected to a rear face of said flange piece.

3. A scan wheel as claimed in claim 2, wherein each spoke arm includes two said radial web pieces having a space between them in the direction of rotation.

4. A scan wheel as claimed in claim 3, wherein the radial web pieces have respective outwardly directed side faces which form said major parts of said spoke arm side faces.

5. A scan wheel as claimed in claim 1, wherein said major parts of said spoke arm side faces do not extend outwards beyond a rearward projection of said front face which, in cross-section, tapers symmetrically inwards by 10° on each side relative to said axis of rotation.

6. A scan wheel as claimed in claim 5, wherein said major parts of said spoke arm side faces do not extend outwards beyond a rearward projection of said front face which, in cross-section, tapers symmetrically inwards by about 12° on each side relative to said axis of rotation.

7. A scan wheel as claimed in claim 1, wherein the respective front face of each said wafer support element is arranged to mount a semiconductor wafer thereon in a wafer mounting plane defining a wafer axis normal to said wafer mounting plane,
   wherein, at least over said predetermined radial distance inwards from an innermost edge of the respective wafer support element, each spoke arm front face has no region facing towards the respective said wafer axis.

8. A scan wheel as claimed in claim 7, wherein, at least over said distance, said spoke arm front faces face away from the respective said wafer axes.

9. A scan wheel as claimed in claim 1, wherein at least over said predetermined radial distance, said spoke arm front faces are angled towards said wheel axis.

10. A scan wheel as claimed in claim 9, wherein said spoke arm front faces are angled relative to a radial plane at between 3° and 10°.

11. A scan wheel as claimed in claim 1, wherein, at least over said predetermined radial distance, said spoke arm front faces are planar.

12. A scan wheel as claimed in claim 1, wherein each said wafer support element front face is arranged to mount a semiconductor wafer thereon in a wafer mounting plane facing towards said wheel axis.

13. A scan wheel as claimed in claim 1, wherein said radial predetermined distance is greater than about 50 mm.

14. A scan wheel as claimed in claim 1, wherein each said spoke arm front face has a portion immediately radially inside said innermost edge of the respective wafer support element front face which is spaced at least one centimetre behind said innermost edge in the direction of said axis.

15. A scan wheel as claimed in claim 14, wherein said portion is spaced about 1.5 centimeters behind said innermost edge.

\* \* \* \* \*